United States Patent [19]
Shim et al.

[11] Patent Number: 5,729,432
[45] Date of Patent: Mar. 17, 1998

[54] BALL GRID ARRAY SEMICONDUCTOR PACKAGE WITH IMPROVED HEAT DISSIPATION AND DEHUMIDIFICATION EFFECT

[75] Inventors: Il Kwon Shim, Seoul; Young Wook Heo, Kyungki-Do, both of Rep. of Korea

[73] Assignees: Anam Industrial Col, Ltd., Rep. of Korea; Amkor Electronics, Inc., Ariz.

[21] Appl. No.: 588,172

[22] Filed: Jan. 18, 1996

[30] Foreign Application Priority Data

Jul. 6, 1995 [KR] Rep. of Korea ............... 1995-19582

[51] Int. Cl.$^6$ ............................................. H05K 7/20
[52] U.S. Cl. ........................ 361/690; 165/80.3; 257/713; 361/719
[58] Field of Search .................... 257/706, 707, 257/712, 713, 721; 165/80.3, 185; 174/252, 16.3; 361/690, 692, 693, 764, 761, 704-710, 717-719

[56] References Cited

U.S. PATENT DOCUMENTS

| | | | |
|---|---|---|---|
| 4,897,508 | 1/1990 | Mahulikar | 174/52.4 |
| 4,964,019 | 10/1990 | Belanger, Jr. | 361/401 |
| 5,173,844 | 12/1992 | Adach | 361/414 |
| 5,369,550 | 11/1994 | Kwon | 361/690 |
| 5,450,283 | 9/1995 | Lin | 361/704 |
| 5,467,251 | 11/1995 | Katchmar | 361/719 |
| 5,561,323 | 10/1996 | Andros | 257/707 |

*Primary Examiner*—Gerald P. Tolin
*Attorney, Agent, or Firm*—Skjerven, Morrill, MacPherson Franklin & Friel; Thomas S. MacDonald

[57] ABSTRACT

A BGA (ball grid array) semiconductor package with improved heat dissipation and dehumidification effect is disclosed. The above BGA package is provided with an open through slot on the chip mounting portion of the printed circuit board and/or the heat sink. The above through slot is occluded by neither the heat conductive epoxy resin nor the solder mask but is simply opened, thus directly exposing the bottom surface of the semiconductor chip to the outside of the package and effectively performing heat dissipation and dehumidification without causing any pop corn phenomenon during the dehumidification reflow. The size of the open through slot is not larger than the semiconductor chip. The open through slot is selected from among a rectangular slot, a large circular slot, a plurality of small circular slots, a radial slot, a cross slot or any combination thereof.

11 Claims, 3 Drawing Sheets

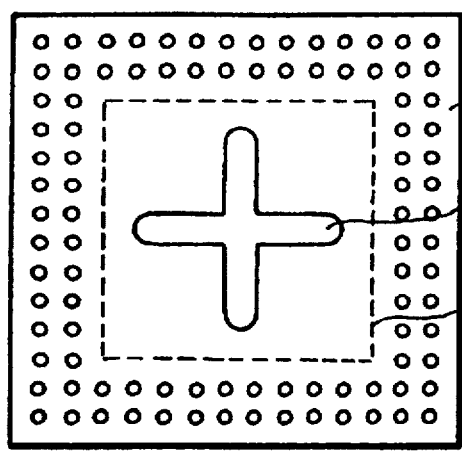
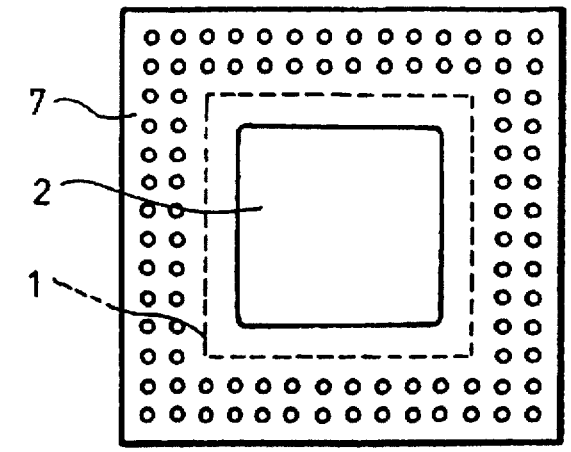
FIG. 3A    FIG. 3B
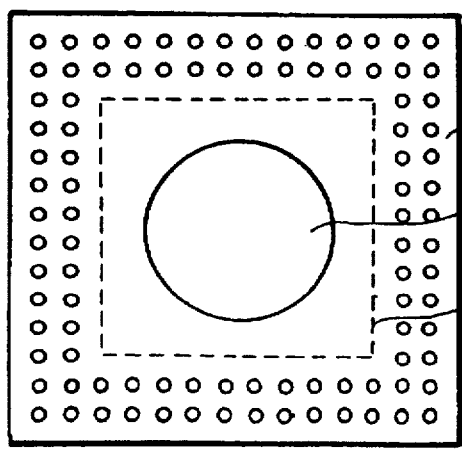
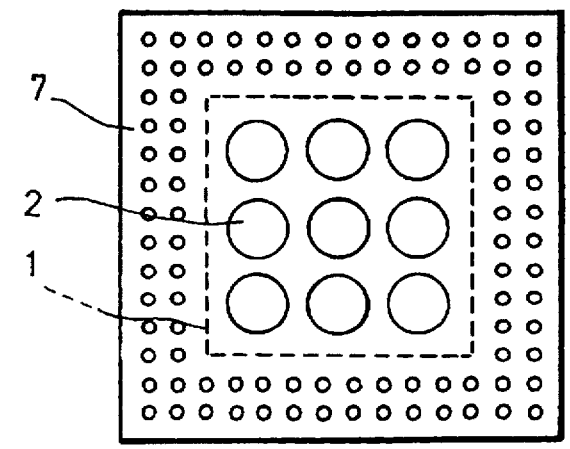
FIG. 3C    FIG. 3D

BALL GRID ARRAY SEMICONDUCTOR PACKAGE WITH IMPROVED HEAT DISSIPATION AND DEHUMIDIFICATION EFFECT

BACKGROUND OF THE INVENTION

1. Field of the Invention

The present invention relates in general to BGA (ball grid array) semiconductor packages with input and output solder ball terminals and, more particularly, to a structural improvement in such BGA semiconductor packages for improving the heat dissipation and dehumidification effect of the packages by forming an open through slot on the chip mounting portion of the package's circuit board and directly exposing the semiconductor chip outside the package.

2. Description of the Prior Art

In a typical process for producing a semiconductor package, the package is molded with a heat sink which is placed above or under a semiconductor chip. The heat sink dissipates heat, which is generated from the semiconductor chip during the operation of the package, to the atmosphere.

FIG. 1 shows the construction of a typical BGA (ball grid array) semiconductor package. As shown in the above drawing, a plurality of through slots 2' are formed on the chip mounting portion of the package's printed circuit board (PCB) 7. As the above through slots 2' of the PCB 7 are filled with both heat conductive epoxy resin 3 and solder mask 5, the slots 2' are labelled as "occluded through slots". During the operation of the above BGA semiconductor package, heat is generated from the semiconductor chip 1. The heat of the chip 1 is primarily transferred to a metal chip pad 4, which is formed on the PCB 7 on which the semiconductor chip 1 is bonded with the heat conductive epoxy resin 3. The heat in turn is transferred to a mother board through the occluded through slots 2' and solder balls 6, thereby being dissipated to the atmosphere. In the above package, each slot 2' has a diameter of about 0.3 mm, while the heat conductive epoxy resin 3 typically uses epoxy resin impregnated with silver.

That is, the heat generated from the semiconductor chip 1 of the typical BGA semiconductor package is dissipated through the heat conductive epoxy resin 3, metal chip pad 4, occluded through slots 2' and solder balls 6. However, the typical BGA package has a problem in that it fails to effectively dissipate the heat of the semiconductor chip to the atmosphere as the heat conductive epoxy resin 3, metal chip pad 4, occluded through slots 2' and solder balls 6 have different heat resistances. Another problem of the above BGA package is resided in that there may be a pop corn phenomenon in the package during the dehumidification reflow. That is, the semiconductor chip 1 may be broken due to rapid expansion of humidity during the dehumidification reflow.

SUMMARY OF THE INVENTION

It is, therefore, an object of the present invention to provide a structurally improved BGA semiconductor package in which the above problems can be overcome and which is provided with an open through slot on the chip mounting portion of the package's circuit board. The above through slot is occluded by neither the heat conductive epoxy resin nor the solder mask but is simply opened, thus directly exposing the bottom surface of the semiconductor chip to the outside of the package and effectively performing heat dissipation and dehumidification without causing any pop corn phenomenon during the dehumidification reflow.

In an embodiment, the present invention provides a ball grid array semiconductor package comprising a printed circuit board (PCB) provided with at least one open through slot on its chip mounting portion, a solder ball welded to the PCB, and a semiconductor chip bonded to the chip mounting portion of the PCB by heat conductive resin. In the above package, a part of the bottom surface of the chip is directly exposed outside the package through the open through slot which is occluded by neither the heat conductive resin nor a solder mask, thus improving heat dissipation and dehumidification effect of the package.

In another embodiment, the present invention provides a ball grid array semiconductor package comprising a printed circuit board (PCB) provided with at least one open through slot on its chip enclosing portion, and a heat sink provided with at least one open through slot on its chip mounting portion. The through slot of the heat sink is smaller than the through slot of the PCB. A semiconductor chip is placed in the through slot of the PCB and bonded to the bottom surface of the chip mounting portion of the heat sink by heat conductive resin. The top surface of the chip of the above package is directly exposed outside the package through the open through slots which are occluded by neither the heat conductive resin nor a solder mask, thus improving heat dissipation and dehumidification effect of the package.

BRIEF DESCRIPTION OF THE DRAWINGS

The above and other objects, features and other advantages of the present invention will be more clearly understood from the following detailed description taken in conjunction with the accompanying drawings, in which:

FIGS. 3A to 3D are views showing different configurations of open through slots of the BGA semiconductor package in accordance with the present invention;

DESCRIPTION OF THE PREFERRED EMBODIMENTS

Figure 1:
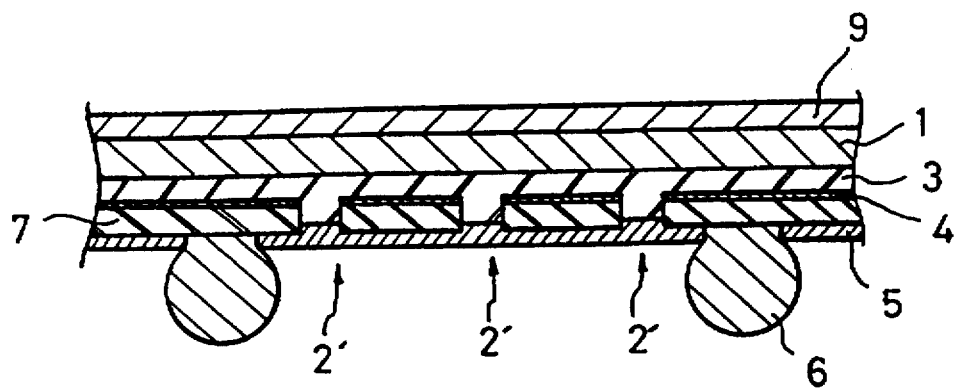
FIG. 1 is a sectional view showing the construction of a typical BGA semiconductor package.
Figure 2A:
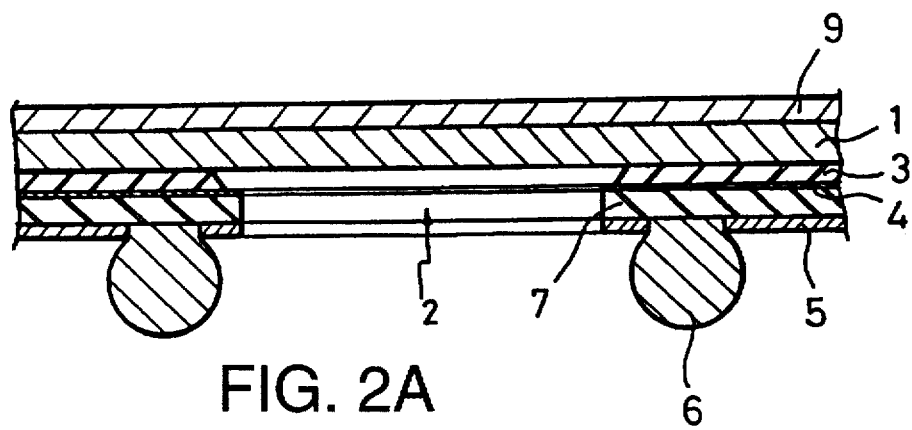
FIGS. 2A and 2B are sectional views showing the constructions of BGA semiconductor packages in accordance with embodiments of the present invention, respectively.
Figure 2B:
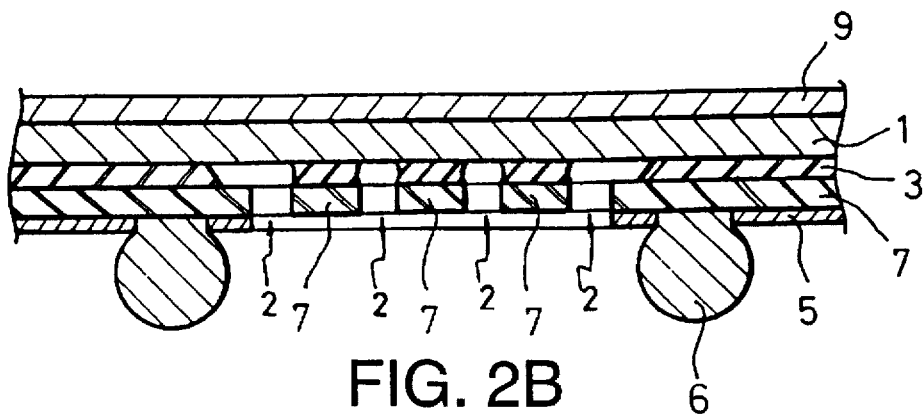

FIGS. 2A and 2B are sectional views showing the constructions of BGA (ball grid array) semiconductor packages in accordance with embodiments of the present invention, respectively. In each of the above BGA semiconductor packages, the heat conductive epoxy resin 3, metal chip pad 4, PCB 7 and solder mask 5 are partially removed from the package, thus forming an open through slot 2 differently from the typical BGA semiconductor package of FIG. 1. The bottom surface of the semiconductor chip 1 is thus directly exposed to the outside of the package through the open through slot 2. In order to expose the chip 1 to the outside of the package, the PCB 7 of the package may be provided with one large slot 2 as shown in FIG. 2A. Alternatively, the PCB 7 of the package may be provided with a plurality of small slots 2 as shown in FIG. 2B.

When the PCB 7 of the package is provided with one large slot 2 as shown in FIG. 2A, the heat dissipation effect of the package will be remarkably improved. Another advantage of the above package is resided in that the package completely removes the pop corn phenomenon during the dehumidification reflow. However, as the exposing area of the chip 1 of the above package is larger, the package may be easily affected by foreign substances such as moisture or dust.

When the PCB 7 of the package is provided with the small slots 2 as shown in FIG. 2B, the package is scarcely affected by foreign substances. In addition, the above package improves the stability of the semiconductor chip 1 as the chip 1 can be more tightly bonded to the PCB 7. However, both the heat dissipation and dehumidification effect of the above package are somewhat inferior than those of the package of FIG. 2A.

FIGS. 3A to 3D show different configurations of the open through slot 2 of the BGA semiconductor package in accordance with the present invention. As shown in the drawings, the above open through slot 2 of the invention may have various configurations. That is, the slot 2 is selected from among a circular, cross, radial or rectangular slot. Of course, the open through slot 2 may have a configuration of any combination of the above-mentioned slot configurations. In the embodiment of FIG. 3D, the open through slot 2 of the BGA package comprises a plurality of small circular holes. In the drawings, the chip mounting area of the PCB 7 is shown by a dotted line.

Alternatively, the through slot 2 of the PCB 7 may have a radial configuration (not shown). As a further alternative, the PCB 7 of the BGA package of this invention may have open through slots which are composition of the above-described configurations.

The above through slot 2 is formed within the chip mounting area of the PCB 7 such that the slot 2 is smaller than the chip mounting area regardless of the number of the through slots. In this regard, the semiconductor chip 1 of the package can be stably mounted to the PCB 7 having the open through slot 2.

Figure 4:
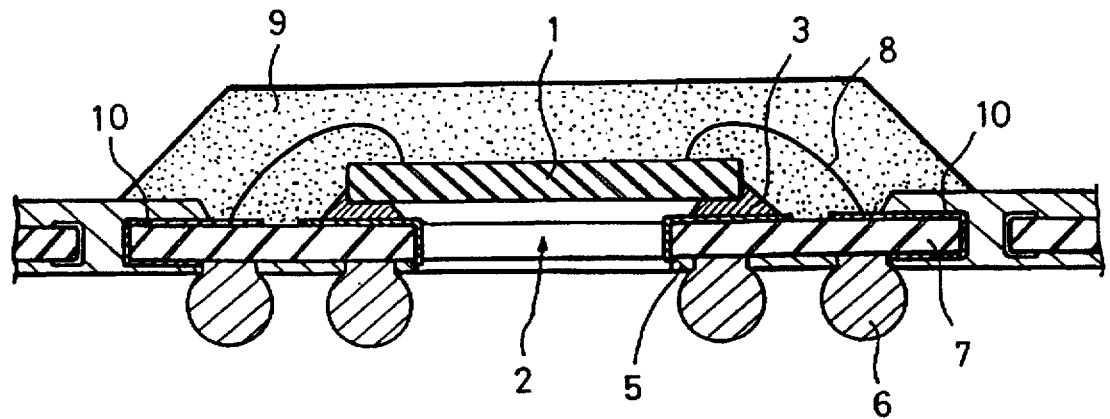
FIG. 4 is a sectional view showing the construction of the BGA semiconductor package having one of the above open through slots of the present invention.

FIG. 4 is a sectional view showing the construction of the BGA semiconductor package having one of the above-mentioned open through slots 2. In the above package, one large open through slot 2 is formed on the center portion or the chip mounting portion of the PCB 7. The semiconductor chip 1 is bonded to the PCB's chip mounting portion about the slot 2 by the heat conductive epoxy resin 3. A plurality of golden wires 8 are bonded to the semiconductor chip 1 and to the metal pattern 10 of the PCB 7. In this case, both ends of each wire 8 are bonded to the chip's pad and metal pattern 10, respectively. The wires 8 are connected to the solder balls 6 through the metal pattern 10. The semiconductor chip 1 in the above state in turn is packaged by an envelope encapsulation material 9. The bottom surface of the chip 1 is partially exposed outside the package through the open through slot 2. As the chip 1 is directly exposed outside the package through the slot 2, the package not only effectively dissipates heat of the chip 1 to the atmosphere, it also effectively dehumidifies during the operation.

Figure 5:
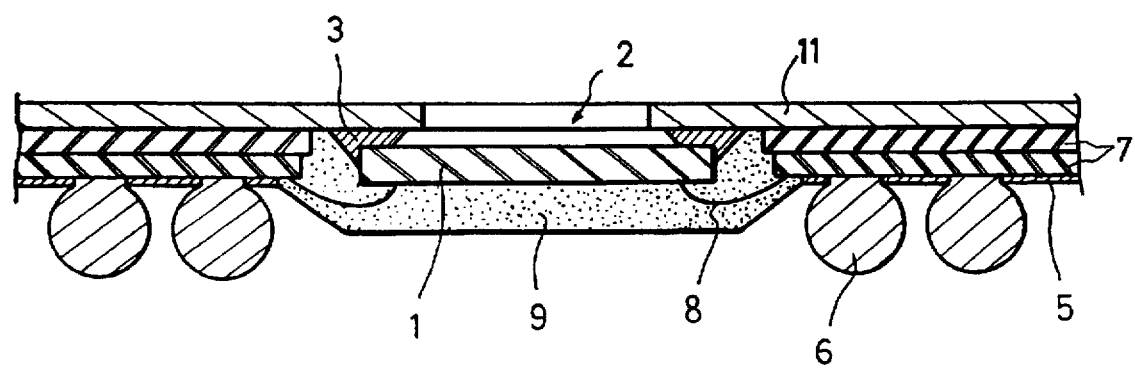
FIG. 5 is a sectional view showing the construction of a BGA semiconductor package in accordance with another embodiment of the present invention.

FIG. 5 is a sectional view showing the construction of a BGA semiconductor package in accordance with another embodiment of the present invention. In this embodiment, the present invention is adapted to a cavity down or die down ball grid array semiconductor package. In the above package, a copper or aluminum heat sink 11 is arranged on the chip 1, while the open through slot 2 is formed on both the heat sink 11 and the PCB 7. In this case, the open through slot 2 is formed on the chip enclosing portion of the PCB 7 and formed on the chip mounting portion of the heat sink 11.

The through slot 2 of the heat sink 11 is smaller than that of the PCB 7. In the above package, the top surface of the chip 1 is partially exposed outside the package through the open through slot 2. The package thus not only effectively dissipates heat of the chip 1 to the atmosphere, it also effectively dehumidifies during the operation.

As described above, the present invention provides a BGA semiconductor package with improved heat dissipation and dehumidification effect. In the above package, at least one open through slot is formed on the chip mounting portion of a PCB and/or a heat sink, thus directly exposing a part of the chip outside the package. As the semiconductor chip is partially exposed outside the package through the open through slot, the package not only effectively dissipates heat of the chip to the atmosphere, it also effectively dehumidifies during the operation. The present invention thus improves the operational reliability of the BGA semiconductor package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ball grid array semiconductor package comprising:
   a printed circuit board having a chip mounting portion and provided with at least one open through slot on the chip mounting portion;
   a solder ball in welded connection to said printed circuit board; and
   a semiconductor chip having a first surface including a pad for attachment of a bonding wire and an opposite second surface, said chip being bonded to the chip mounting portion of said printed circuit board such that a part of the second surface of said chip is directly exposed to the outside of the package through said open through slot, said open through slot not being occluded, thus improving heat dissipation and dehumidification effect of the package.

2. The ball grid array semiconductor package according to claim 1, wherein the size of said open through slot is not larger than said semiconductor chip.

3. The ball grid array semiconductor package according to claim 1, wherein said open through slot is selected from a rectangular slot, a large circular slot, a plurality of small circular slots, a radial slot, a cross slot or any combination thereof.

4. A ball grid array semiconductor package comprising:
   a printed circuit board having a chip enclosing portion provided with at least one open through slot on the chip enclosing portion;
   a heat sink having a chip mounting portion provided with at least one open through slot on the chip mounting portion and mounted to said printed circuit board, said through slot of the heat sink having a size smaller than that of the through slot of said printed circuit board;
   a solder ball in welded connection to said printed circuit board; and
   a semiconductor chip placed in the through slot of the printed circuit board and bonded to the bottom surface of said chip mounting portion of the heat sink by a heat conductive resin such that a part of the top surface of said chip is directly exposed to the outside of the package through said open through slot of said heat sink, said open through slot of said heat sink not being occluded by the heat conductive resin, thus improving heat dissipation and dehumidification effect of the package.

5. The ball grid array semiconductor package according to claim 4, wherein the size of said open through slot of the heat sink is not larger than said semiconductor chip.

6. The ball grid array semiconductor package according to claim 4, wherein said open through slots on said printed circuit board and said heat sink are selected from a rectangular slot, a large circular slot, a plurality of small circular slots, a radial slot, a cross slot of any combination thereof.

7. A semiconductor package comprising:

a semiconductor chip;

a package having a first portion and a second portion enclosing the semiconductor chip, at least one of said first and second portions having an open through slot;

a printed circuit board including a metal pattern electrically connected to a first surface of said semiconductor chip; and a solder ball in welded connection to said printed circuit board, wherein at least a part of a second surface of said semiconductor chip opposite to said first surface is directly exposed to the outside of the package through said open through slot, thus improving heat dissipation and dehumidification effect of the package.

8. A semiconductor package according to claim 7, wherein said semiconductor chip is mounted on the printed circuit board, and said second portion comprises an encapsulation material.

9. A semiconductor package according to claim 7, wherein said first portion comprises a heat sink, and said second portion comprises an encapsulation material.

10. A semiconductor package according to claim 7, wherein said semiconductor chip is electrically connected by a wire bond to said printed circuit board.

11. A semiconductor package according to claim 8, wherein said printed circuit board includes a metal pattern, said semiconductor chip being electrically connected by a wire bond to said metal pattern.

* * * * *